United States Patent
Hashimoto

(10) Patent No.: US 11,961,462 B2
(45) Date of Patent: Apr. 16, 2024

(54) ELECTRONIC DEVICE FOR GENERATING BIAS SIGNAL BASED ON GATE CONTROL SIGNAL

(71) Applicant: Innolux Corporation, Miaoli County (TW)

(72) Inventor: Kazuyuki Hashimoto, Miaoli County (TW)

(73) Assignee: Innolux Corporation, Miaoli County (TW)

( * ) Notice: Subject to any disclaimer, the term of this patent is extended or adjusted under 35 U.S.C. 154(b) by 0 days.

(21) Appl. No.: 18/163,303

(22) Filed: Feb. 2, 2023

(65) Prior Publication Data
US 2023/0386394 A1    Nov. 30, 2023

Related U.S. Application Data

(60) Provisional application No. 63/345,035, filed on May 24, 2022.

(51) Int. Cl.
*G09G 3/32*   (2016.01)
*H01L 29/93*   (2006.01)
*H03K 19/0948*   (2006.01)

(52) U.S. Cl.
CPC ............... *G09G 3/32* (2013.01); *H01L 29/93* (2013.01); *H03K 19/0948* (2013.01); *G09G 2310/0243* (2013.01)

(58) Field of Classification Search
CPC ........................................ G09G 3/32
See application file for complete search history.

(56) References Cited

U.S. PATENT DOCUMENTS

2005/0285827 A1    12/2005    Eom

OTHER PUBLICATIONS

"Search Report of Europe Counterpart Application", dated Jun. 26, 2023, p. 1-p. 14.

*Primary Examiner* — Gustavo Polo
(74) *Attorney, Agent, or Firm* — JCIPRNET

(57) ABSTRACT

An electronic device is provided. The electronic device includes a pixel array, a gate driver and a bias signal driver. The pixel array includes a pixel unit. The gate driver generates a plurality of gate control signals. The bias signal driver is electrically connected to the pixel unit and the gate driver, and configured to generate a bias signal to activate the pixel unit according to a part of the plurality of gate control signals. The bias signal driver includes a first logic circuit and a second logic circuit.

20 Claims, 15 Drawing Sheets

ELECTRONIC DEVICE FOR GENERATING BIAS SIGNAL BASED ON GATE CONTROL SIGNAL

CROSS-REFERENCE TO RELATED APPLICATION

This application claims the priority benefit of U.S. provisional application Ser. No. 63/345,035, filed on May 24, 2022. The entirety of the above-mentioned patent application is hereby incorporated by reference herein and made a part of this specification.

BACKGROUND

Technical Field

The disclosure relates a device, particularly, the disclosure relates to an electronic device.

Description of Related Art

In general, a voltage source circuit or a current source circuit need three control signals, for example, a scan signal, a reset signal and a bias signal, to implement a compensation of a threshold voltage of the voltage source circuit or the current source circuit for a pixel unit in a pixel array of a panel. However, a conventional voltage source circuit or a conventional current source circuit may receive the scan signal and the reset signal from the gate driver integrated circuit (IC), but the bias signal is not provided. Therefore, the conventional voltage source circuit or the conventional current source circuit needs to additionally design a complicated bias signal generation IC to provide the bias signal to the pixel units, thus resulting in an increase in circuit cost.

SUMMARY

The electronic device of the disclosure includes a pixel array, a gate driver and a bias signal driver. The pixel array includes a pixel unit. The gate driver generates a plurality of gate control signals. The bias signal driver is electrically connected to the pixel unit and the gate driver, and configured to generate a bias signal to activate the pixel unit according to a part of the plurality of gate control signals. The bias signal driver includes a first logic circuit and a second logic circuit.

Based on the above, according to the electronic device of the disclosure, the electronic device can generate the bias signal to activate the pixel unit according to the part of the plurality of gate control signals without additionally disposing a complicated bias signal generation IC.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1:
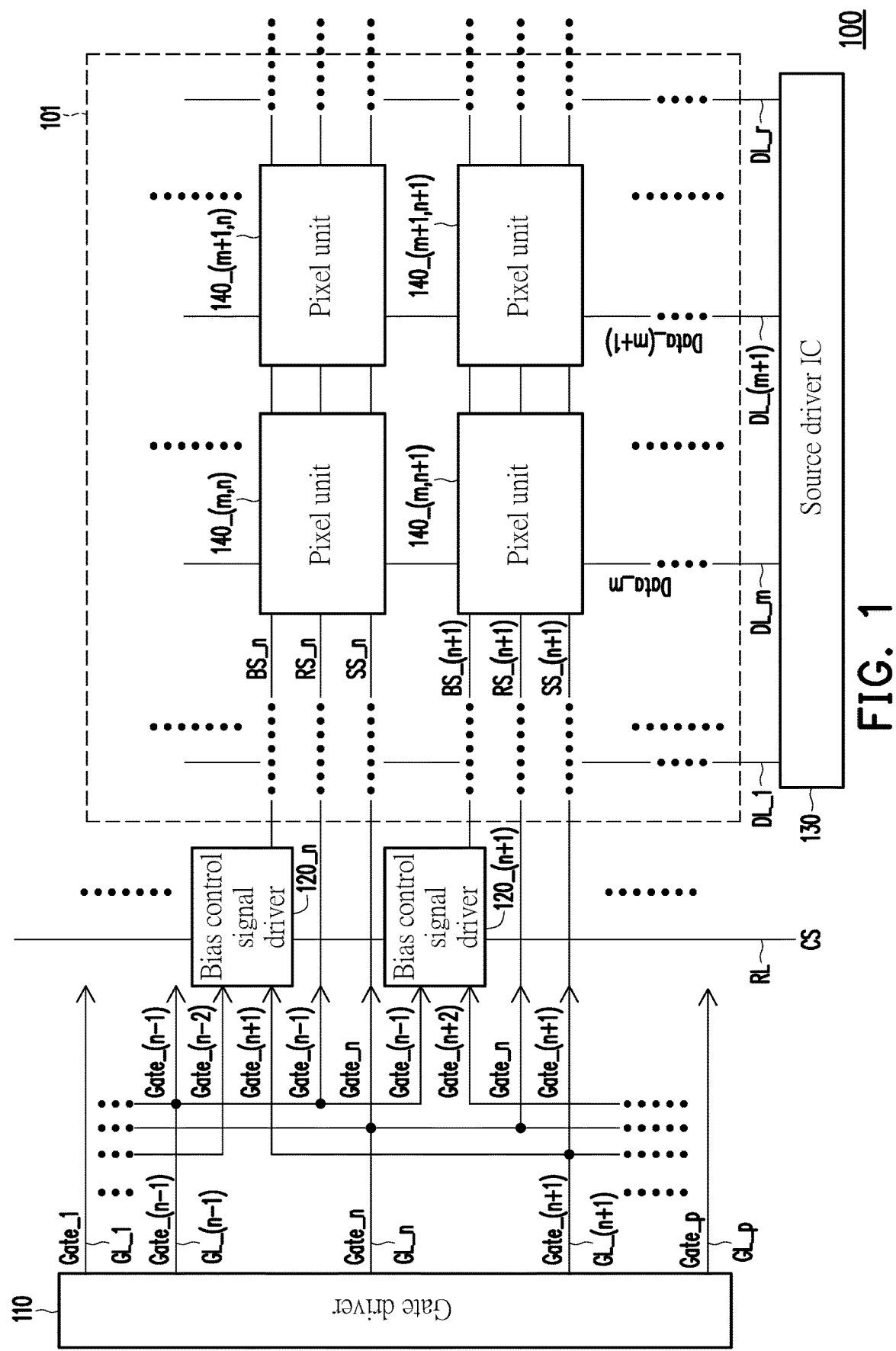
FIG. 1 is a circuit schematic diagram of an electronic device according to an embodiment of the disclosure.

Reference will now be made in detail to the exemplary embodiments of the disclosure, examples of which are illustrated in the accompanying drawings. Whenever possible, the same reference numbers are used in the drawings and the description to refer to the same or like components.

Certain terms are used throughout the specification and appended claims of the disclosure to refer to specific components. Those skilled in the art should understand that electronic device manufacturers may refer to the same components by different names. This article does not intend to distinguish those components with the same function but different names. In the following description and rights request, the words such as "comprise" and "include" are open-ended terms, and should be explained as "including but not limited to . . . ".

The term "coupling (or electrically connection)" used throughout the whole specification of the present application (including the appended claims) may refer to any direct or indirect connection means. For example, if the text describes that a first device is coupled (or electrically connected) to a second device, it should be interpreted that the first device may be directly connected to the second device, or the first device may be indirectly connected through other devices or certain connection means to be connected to the second device. The terms "first", "second", and similar terms mentioned throughout the whole specification of the present application (including the appended claims) are merely used to name discrete elements or to differentiate among different embodiments or ranges. Therefore, the terms should not be regarded as limiting an upper limit or a lower limit of the quantity of the elements and should not be used to limit the arrangement sequence of elements. In addition, wherever possible, elements/components/steps using the same reference numerals in the drawings and the embodiments represent the same or similar parts. Reference may be mutually made to related descriptions of elements/components/steps using the same reference numerals or using the same terms in different embodiments.

The electronic device of the disclosure may include, for example, an active-matrix device for antenna application or display application, and the pixel unit includes an electronic element and a voltage source circuit or a current source circuit. The electronic element of the disclosure may be, for example, a varactor, a light emitting diode, a voltage-controlled element or a current-controlled element. It should be noted that, the electronic device of the disclosure may be manufactured using a display panel process, and related transistors and electronic components are fabricated on a glass substrate.

It should be noted that in the following embodiments, the technical features of several different embodiments may be replaced, recombined, and mixed without departing from the spirit of the disclosure to complete other embodiments. As long as the features of each embodiment do not violate the spirit of the disclosure or conflict with each other, they may be mixed and used together arbitrarily.

FIG. 1 is a circuit schematic diagram of an electronic device according to an embodiment of the disclosure. Referring to FIG. 1, the electronic device 100 includes a pixel array 101, a gate driver 110, a plurality of bias control signal drivers and a source driver integrated circuit (IC) 130. The pixel array 101 includes a plurality of pixel units. The gate driver 110 is electrically connected to the bias control signal drivers through a part of a plurality of gate lines GL_1 to GL_p, and is further electrically connected to pixel units of each row of the pixel array 101 through another part of the gate lines GL_1 to GL_p, where p is a positive integer. Each of the bias control signal drivers is electrically connected to pixel units of each row of the pixel array 101. The source driver IC 130 is electrically connected to pixel units of each column of the pixel array 101 through a plurality of data lines DL_1 to DL r, where r is a positive integer. In one embodiment, the bias control signal drivers may further be electrically connected to one or more reset signal lines RL to receive one or more reset signals CS.

In the embodiment of the disclosure, taking the pixel units 140_(m,n), 140_(m+1,n), 140_(m,n+1) and 140_(m+1,n+1) as example, the gate driver 110 is electrically connected to the bias control signal driver 120_*n* and the bias control signal driver 120_(n+1) through the gate lines GL_(n−2), GL_(n−1), GL_(n+1) and GL_(n+2), where n and m are positive integers. The gate driver 110 is electrically connected to the pixel units 140_(m,n), 140_(m+1,n), 140_(m,n+1) and 140_(m+1,n+1) through the gate lines GL_(n−1), GL_n and GL_(n+1). The gate lines GL_(n−2) to GL_(n+2) are configured to transmit the gate control signals Gate_(n−2) to Gate_(n+2). The bias control signal driver 120_*n* may generate the bias signal BS_n to activate the pixel unit 140_(m,n) and the pixel unit 140_(m+1,n) of an n-th row of the pixel array 101 according to the gate control signal Gate_(n−2) and the gate control signal Gate_(n+1). The bias control signal driver 120_(n+1) may generate the bias signal BS (n+1) to activate the pixel unit 140_(m,n+1) and the pixel unit 140_(m+1,n+1) of the (n+1)-th row of the pixel array 101 according to the gate control signal Gate_(n−1) and the gate control signal Gate_(n+2). The pixel unit 140_(m,n) and the pixel unit 140_(m+1,n) may receive the gate control signal Gate_(n−1), and use the gate control signal Gate_(n−1) as a reset signal RS_n. The gate control signal Gate_(n−1) may be configured to reset the plurality of pixel units of the n-th row of the pixel array 101. The pixel unit 140_(m,n) and the pixel unit 140_(m+1,n) may receive the gate control signal Gate_n, and use the gate control signal Gate_n as a scan signal SS_n. The gate control signal Gate_n may be configured to set a data voltage for the plurality of pixel units of the n-th row of the pixel array 101. The pixel unit 140_(m,n+1) and the pixel unit 140_(m+1,n+1) may receive the gate control signal Gate_n, and use the gate control signal Gate_n as a reset signal RS (n+1). The pixel unit 140_(m,n+1) and the pixel unit 140_(m+1,n+1) may receive the gate control signal Gate_(n+1), and use the gate control signal Gate_(n+1) as a scan signal SS (n+1). The pixel unit 140_(m,n) and the pixel unit 140_(m,n+1) may receive the data signal Date_m through the data line DL_m. The pixel unit 140_(m+1,n) and the pixel unit 140_(m+1,n+1) may receive the data signal Date (m+1) through the data line DL (m+1).

In the embodiment of the disclosure, the pixel array 101 may be disposed in an active area (AA), and the gate driver 110, the bias control signal drivers and the source driver IC 130 may be disposed in a surrounding area. The surrounding area may surround the active area.

Figure 2:
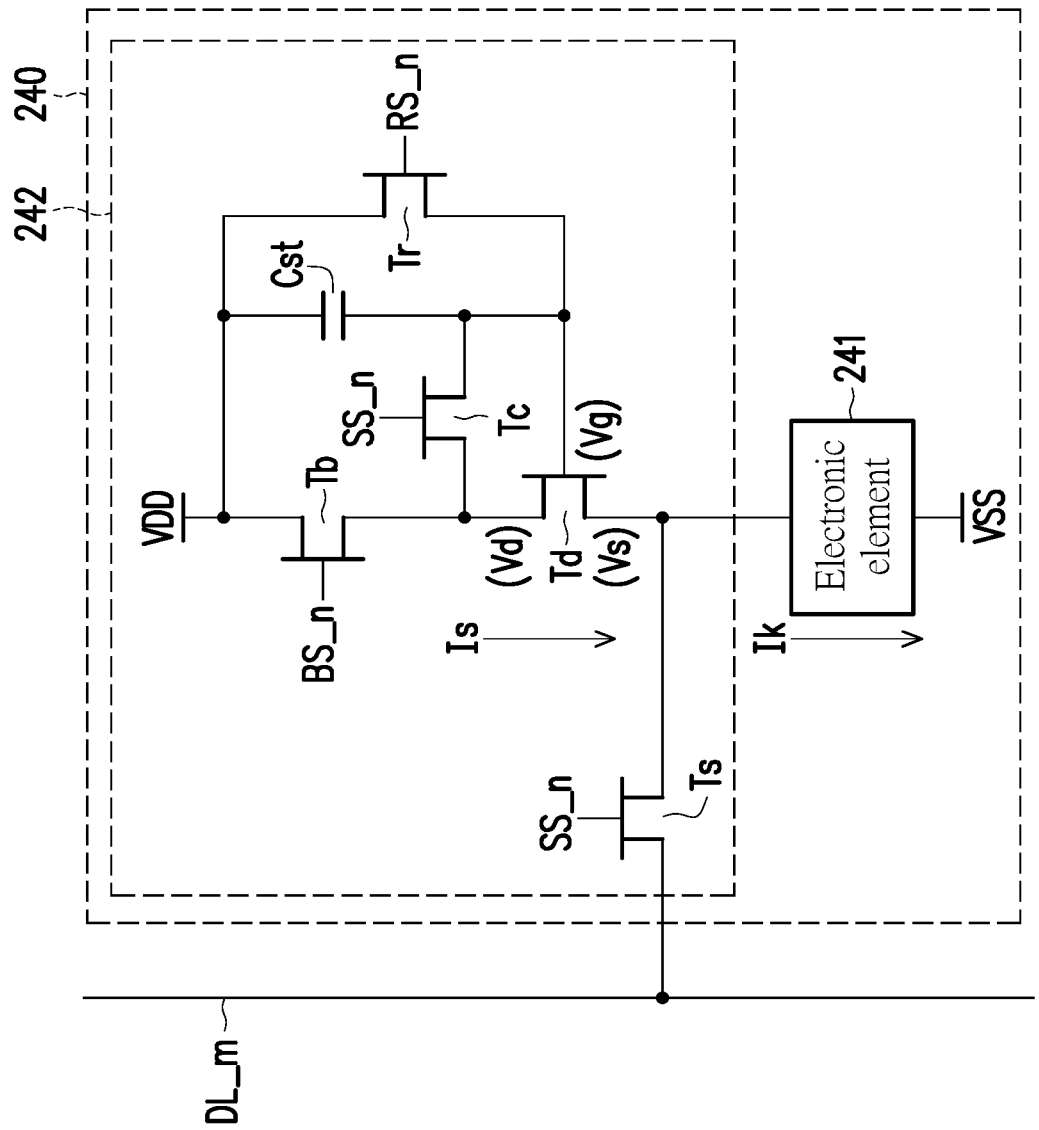
FIG. 2 is a circuit schematic diagram of a pixel unit according to an embodiment of the disclosure.

FIG. 2 is a circuit schematic diagram of a pixel unit according to an embodiment of the disclosure. Referring to FIG. 2, the pixel unit 140_(m,n) of FIG. 1 may be implemented as a pixel unit 240 of FIG. 2, and each pixel unit of the disclosure may also be similarly implemented as the pixel unit 240. In the embodiment of the disclosure, the pixel unit 240 includes an electronic element 241 and a voltage source circuit 242. The voltage source circuit 242 is configured to provide a source current Is to the electronic element 241, and the electronic element 241 may generate a leak current Ik. The voltage source circuit 242 includes a driver transistor Td, a scan transistor Ts, a compensation transistor Tc, a bias transistor Tb, a reset transistor Tr and a storage capacitor Cst.

In the embodiment of the disclosure, a first terminal of the scan transistor Ts is electrically connected to the data line DL_m. A second terminal of the scan transistor Ts is electrically connected to the electronic element 241 and the driver transistor Td. A control terminal of the scan transistor Ts receives the scan signal SS_n. A first terminal of the driver transistor Td is electrically connected to the bias transistor Tb and the compensation transistor Tc. A second terminal of the driver transistor Td is electrically connected to the electronic element 241 and the second terminal of the scan transistor Ts. A control terminal of the driver transistor Td is electrically connected to the compensation transistor Tc, the reset transistor Tr and the storage capacitor Cst. A first terminal of the bias transistor Tb is electrically connected to a first operation voltage VDD. A second terminal of the bias transistor Tb is electrically connected to the first terminal of the driver transistor Td and the compensation transistor Tc. A control terminal of the bias transistor Tb receives the bias signal BS_n. A first terminal of the compensation transistor Tc is electrically connected to the first terminal of the driver transistor Td and the second terminal of the bias transistor Tb. A second terminal of the compensation transistor Tc is electrically connected to the control terminal of the driver transistor Td, the storage capacitor Cst and the reset transistor Tr. A control terminal of the compensation transistor Tc receives the scan signal SS_n. A first terminal of the capacitor Cst is electrically connected to the first operation voltage VDD and the reset transistor Tr. A second terminal of the capacitor Cst is electrically connected to the control terminal of the driver transistor Td, the second terminal of the compensation transistor Tc and the reset transistor Tr. A first terminal of the reset transistor Tr is electrically connected to the first operation voltage VDD. A second terminal of the reset transistor Tr is electrically connected to the control terminal of the driver transistor Td, the storage capacitor Cst and the second terminal of the compensation transistor Tc. A control terminal of the reset transistor Tr receives the reset signal RS_n. The electronic element 241 is electrically connected between the voltage source circuit 242 and a second operation voltage VSS. In the embodiment of the disclosure, the driver transistor Td, the scan transistor Ts, the compensation transistor Tc, the bias transistor Tb and the reset transistor Tr may be a n-type transistor (e.g., Thin-Film Transistor (TFT)), respectively. In the embodiment of the disclosure, the first operation voltage VDD may be greater than the second operation voltage VSS, but the disclosure is not limited thereto. In one embodiment of the disclosure, the driver transistor Td may also be a p-type transistor, and the second operation voltage VSS may be greater than the first operation voltage VDD.

Figure 3:
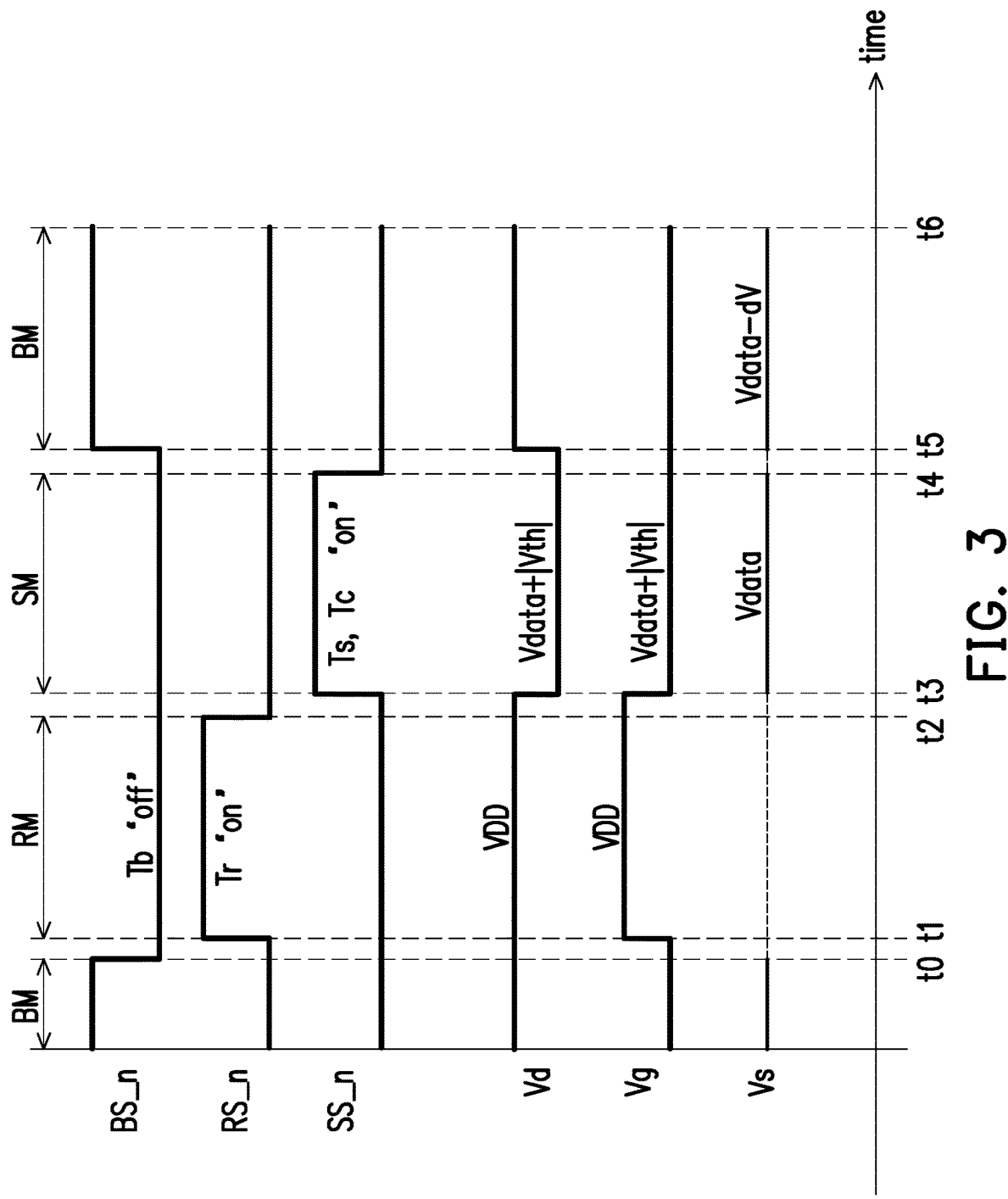
FIG. 3 is an operation timing diagram of the pixel unit according to the embodiment of FIG. 2 of the disclosure.

FIG. 3 is an operation timing diagram of the pixel unit according to the embodiment of FIG. 2 of the disclosure. Referring to FIG. 2 and FIG. 3, the pixel unit 240 may be operated in a bias period BM, a reset period RM and a scan period SM according to the bias signal BS_n, the reset signal RS_n and the scan signal SS_n. During the reset period RM from time t1 to time t2, the reset signal RS_n may be a high voltage level, and the bias signal BS_n and the scan signal SS_n may be a low voltage level. The reset transistor Tr is turned-on, and the other transistors are turned-off. The voltage Vd of the first terminal and the voltage Vg of the control terminal of the driver transistor Td may equal to the first operation voltage VDD. During the scan period SM from time t3 to time t4, the scan signal SS_n may be the high voltage level, and the bias signal BS_n and the reset signal RS_n may be the low voltage level. The scan transistor Ts and the compensation transistor Tc are turned-on, and the other transistors are turned-off. The scan transistor Ts may provide the data signal with a data voltage Vdata to the second terminal of the driver transistor Td. Thus, the voltage Vs of the second terminal of the driver transistor Td may equal to the data voltage Vdata. The voltage Vd of the first terminal and the voltage Vg of the control terminal of the driver transistor Td may equal to the voltage of the data voltage Vdata plus threshold voltage |Vth| of the driver transistor Td. During the bias period BM from time t5 to time t6 and before time to, the bias signal BS_n may be a high voltage level, and the reset signal RS_n and the scan signal SS_n may be a low voltage level. The voltage Vd of the first terminal of the driver transistor Td may be set to the first operation voltage VDD, and the voltage Vg of the control terminal of the driver transistor Td may hold at the voltage of the data voltage Vdata plus threshold voltage |Vth| of the driver transistor Td by the storage capacitor Cst. Thus, the voltage Vs of the second terminal of the driver transistor Td may be the voltage of the data voltage Vdata minus a delta voltage dV caused by the source current Is for compensating the leak current Ik. Therefore, the electronic element 241 may be driven efficiently and stably.

Figure 4:
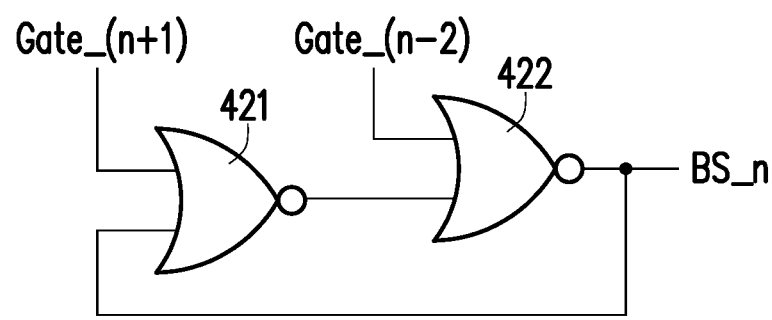
FIG. 4 is a circuit schematic diagram of a bias signal driver according to an embodiment of the disclosure.

FIG. 4 is a circuit schematic diagram of a bias signal driver according to an embodiment of the disclosure. Referring to FIG. 1 and FIG. 4, the bias signal driver 120_n of FIG. 1 may be implemented as a bias signal driver 420 of FIG. 4, and each bias signal driver of the disclosure may also be similarly implemented as the bias signal driver 420. In the embodiment of the disclosure, the bias signal driver 420 includes a first logic circuit 421 and a second logic circuit 422. The first logic circuit 421 and the second logic circuit 422 may be the same logic circuit, but the disclosure is not limited thereto. In the embodiment of the disclosure, the first logic circuit 421 and the second logic circuit 422 are two NOR gate circuits. A first input terminal of the first logic circuit 421 is electrically connected to the gate line GL_(n+1) to receive the gate control signal Gate_(n+1), and a second terminal of the first logic circuit 421 is electrically connected to an output terminal of the second logic circuit 422 to receive the bias signal BS_n. A first input terminal of the second logic circuit 422 is electrically connected to the gate line GL_(n−2) to receive the gate control signal Gate_(n−2), and a second terminal of the second logic circuit 422 is electrically connected to an output terminal of the first logic circuit 421 to receive an output signal of the first logic circuit 421. The output terminal of the second logic circuit 422 outputs the bias signal BS_n according to the gate control signal Gate_(n−2) and the output signal of the first logic circuit 421. Therefore, the bias signal driver 420 may provide the bias signal BS_n according to the gate control signal Gate_(n−2) and the gate control signal Gate_(n+1).

Figure 5:
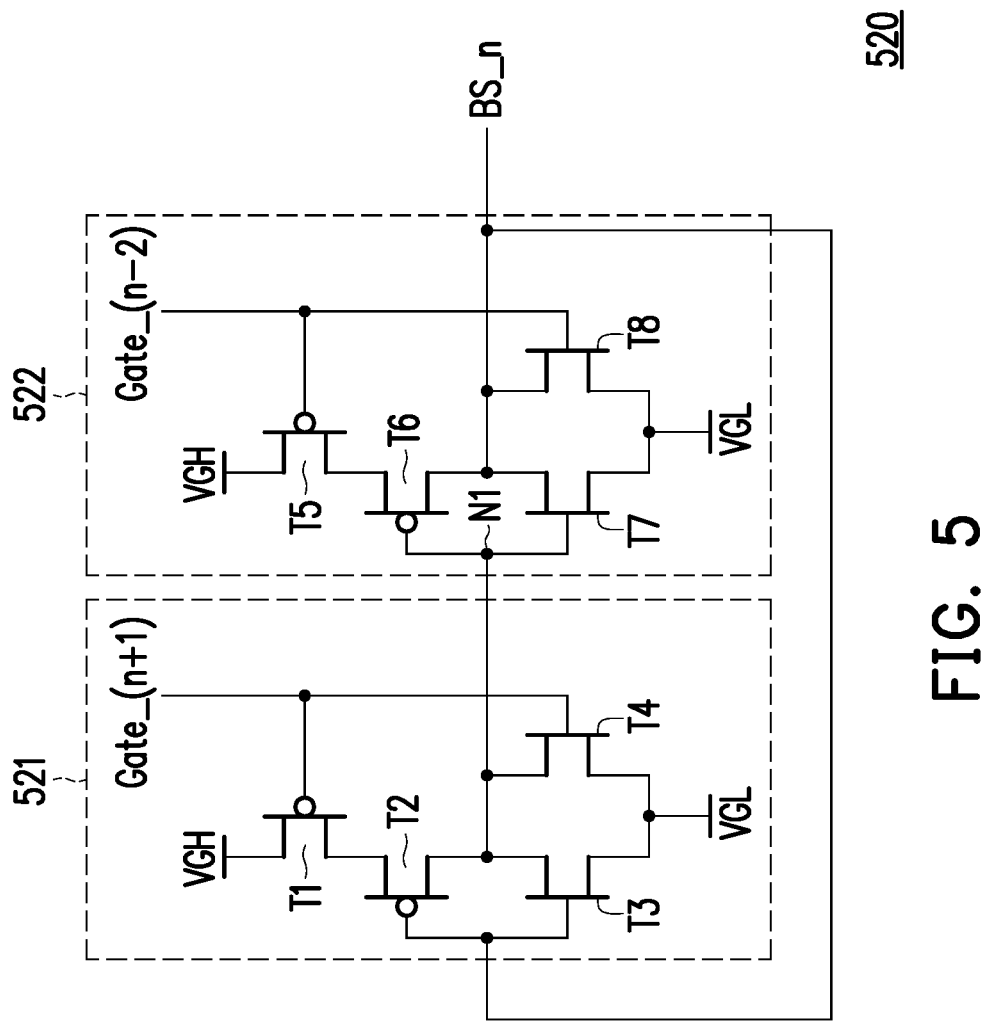
FIG. 5 is a circuit schematic diagram of a CMOS logic circuit according to the embodiment of FIG. 4 of the disclosure.

FIG. 5 is a circuit schematic diagram of a CMOS logic circuit according to the embodiment of FIG. 4 of the disclosure. In the embodiment of the disclosure, the first logic circuit 421 and the second logic circuit 422 of FIG. 4 may be implemented as the CMOS logic circuit as shown in FIG. 5, but the disclosure is not limited thereto. Referring to FIG. 5, the bias signal driver 520 includes a first logic circuit 521 and a second logic circuit 522. The first logic circuit 521 includes a plurality of transistors T1 to T4, and the second logic circuit 522 includes a plurality of transistors T5 to T8. In the embodiment of the disclosure, a first terminal of the transistor T1 is electrically connected to a voltage VGH. A second terminal of the transistor T1 is electrically connected to a first terminal of the transistor T2. A control terminal of the transistor T1 is electrically connected to the gate line GL_(n+1) to receive the gate control signal Gate_(n+1). A second terminal of the transistor T2 is electrically connected to a first terminal of the transistor T3, a first terminal of the transistor T4 and a node N1 between the first logic circuit 521 and the second logic circuit 522. A control terminal of the transistor T2 is electrically connected to an output terminal of the second logic circuit 522 and a control terminal of the transistor T3, and receives the bias signal BS_n. The first terminal of the transistor T3 is electrically connected to the second terminal of the transistor T2, the first terminal of the transistor T4 and the node N1. A second terminal of the transistor T3 is electrically connected to a voltage VGL. The control terminal of the transistor T3 is electrically connected to the output terminal of the second logic circuit 522 and the control terminal of the transistor T2, and receives the bias signal BS_n. The first terminal of the transistor T4 is electrically connected to the second terminal of the transistor T2, the first terminal of the transistor T3 and the node N1. A second terminal of the transistor T4 is electrically connected to the voltage VGL. A control terminal of the transistor T4 is electrically connected to the gate line GL_(n+1) to receive the gate control signal Gate_(n+1).

In the embodiment of the disclosure, a first terminal of the transistor T5 is electrically connected to the voltage VGH. A second terminal of the transistor T5 is electrically connected to a first terminal of the transistor T6. A control terminal of the transistor T5 is electrically connected to the gate line GL_(n−2) to receive the gate control signal Gate_(n−2). A second terminal of the transistor T6 is electrically connected to a first terminal of the transistor T7, a first terminal of the transistor T8 and the output terminal of the second logic circuit 522. A control terminal of the transistor T6 is electrically connected to the node N1 (i.e. an output terminal of the first logic circuit 521) and a control terminal of the transistor T7, and receives the output signal of the first logic circuit 521. The first terminal of the transistor T7 is electrically connected to the second terminal of the transistor T6, the first terminal of the transistor T8 and the output terminal of the second logic circuit 522. A second terminal of the transistor T7 is electrically connected to the voltage VGL. The control terminal of the transistor T7 is electrically connected to the node N1 (i.e. the output terminal of the first logic circuit 521) and the control terminal of the transistor T6, and receives the output signal of the first logic circuit 521. The first terminal of the transistor T8 is electrically connected to the second terminal of the transistor T6, the first terminal of the transistor T7 and the output terminal of the second logic circuit 522. A second terminal of the transistor T8 is electrically connected to the voltage VGL. A control terminal of the transistor T8 is electrically connected to the gate line GL_(n−2) to receive the gate control signal Gate_(n−2).

In the embodiment of the disclosure, the transistors T1, T2, T5 and T6 may be p-type transistors, and the transistors T3, T4, T7 and T8 may be n-type transistors. The voltage VGH may be greater than the voltage VGL, but the disclosure is not limited thereto.

Figure 6:
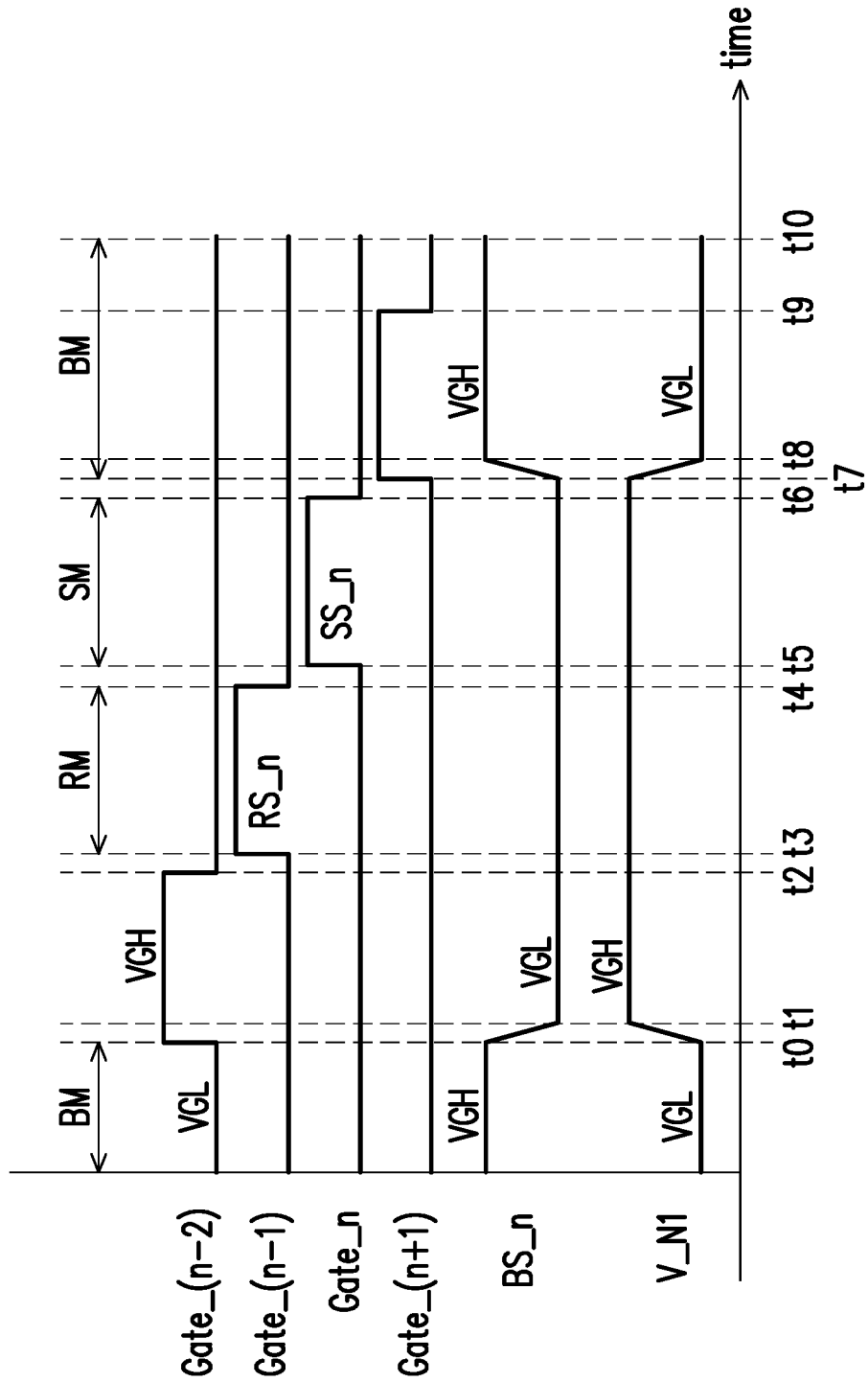
FIG. 6 is an operation timing diagram of the CMOS logic circuit according to the embodiment of FIG. 5 of the disclosure.

FIG. 6 is an operation timing diagram of the CMOS logic circuit according to the embodiment of FIG. 5 of the disclosure. Referring to FIG. 1, FIG. 5 and FIG. 6, during the period from time t0 to time t2, the gate control signal Gate_(n−2) is changed to the voltage VGH, and the gate control signal Gate_(n+1) is maintained at the voltage VGL. Thus, based on the gate control signal Gate_(n−2) having the voltage VGH, the transistor T5 is turned-off and the transistor T8 is turned-on. Since the transistor T8 is turned-on, the voltage of the bias signal BS_n is pulled-down from the voltage VGH to the voltage VGL during the period from time t0 to time t1. Based on the bias signal BS_n having the voltage VGL, the transistor T2 is turned-on, and the transistor T3 is turned-off. Based on the gate control signal Gate_(n+1) having the voltage VGL, the transistor T1 is turned-on, and the transistor T4 is turned-off. Since the transistor T1 and the transistor T2 are turned-on, the voltage V_N1 of the node N1 is pulled-up from the voltage VGL to the voltage VGH during the period from time t0 to time t1, and the voltage V_N1 of the node N1 is maintained at the voltage VGH during the period from time t1 to time t2.

During the reset period RM from time t3 to time t4, the gate control signal Gate_(n−1) is changed to the voltage VGH, which is directly used as the reset signal RS_n. During the scan period SM from time t5 to time t6, the gate control signal Gate_n is changed to the voltage VGH, which is directly used as the scan signal SS_n. During the period from time t2 to time t7, the gate control signal Gate_(n−2) and the gate control signal Gate_(n+1) are maintained at the voltage VGL. Thus, based on the gate control signal Gate_(n+1) having the voltage VGL, the transistor T1 is turned-on, and the transistor T4 is turned-off. Based on the bias signal BS_n having the voltage VGL before time t2, the transistor T2 is turned-on, and the transistor T3 is turned-off. Since the transistor T1 and the transistor T2 are turned-on, the voltage V_N1 of the node N1 is maintained at the voltage VGH. Moreover, based on the gate control signal Gate_(n−2) having the voltage VGL, the transistor T5 is turned-on, and the transistor T8 is turned-off. Based on the voltage V_N1 of the node N1 having the voltage VGH, the transistor T6 is turned-off and the transistor T7 is turned-on. Since the transistor T7 is turned-on, the voltage of the bias signal BS_n is maintained at the voltage VGL. That is, the closed loop formed by the above description locks the voltage V_N1 of the node N1 at the voltage VGH and the voltage of the bias signal BS_n at the voltage VGL.

During the bias period BM from time t7 to time t10 and before time t0, the bias signal driver 420 may output the bias signal BS_n having the voltage VGH. During the period from time t7 to time t9, the gate control signal Gate_(n−2) is maintained at the voltage VGL, and the gate control signal Gate_(n+1) is changed to the voltage VGH. Thus, based on the gate control signal Gate_(n+1) having the voltage VGH, the transistor T1 is turned-off and the transistor T4 is turned-on. Since the transistor T4 is turned-on, the voltage V_N1 of the node N1 is pulled-down from the voltage VGH to the voltage VGL during the period from time t7 to time t8. Based on the gate control signal Gate_(n−2) having the voltage VGL, the transistor T5 is turned-on, and the transistor T8 is turned-off. Based on the voltage V_N1 of the node N1 having the voltage VGL, the transistor T6 is turned-on, and the transistor T7 is turned-off. Since the transistor T5 and the transistor T6 are turned-on, the voltage of the bias signal BS_n is pulled-up from the voltage VGL to the voltage VGH.

Moreover, during the period from time t9 to time t10 and before time t0, the gate control signal Gate_(n−2) and the gate control signal Gate_(n+1) are maintained at the voltage VGL. Thus, based on the gate control signal Gate_(n+1) having the voltage VGL, the transistor T1 is turned-on, and the transistor T4 is turned-off. Based on the bias signal BS_n having the voltage VGH before time t9, the transistor T2 is turned-off and the transistor T3 is turned-on. Since the transistor T3 is turned-on, the voltage V_N1 of the node N1 is maintained at the voltage VGL. Moreover, based on the gate control signal Gate_(n−2) having the voltage VGL, the transistor T5 is turned-on, and the transistor T8 is turned-off. Based on the voltage V_N1 of the node N1 having the voltage VGL, the transistor T6 is turned-on, and the transistor T7 is turned-off. Since the transistor T5 and the transistor T6 are turned-on, the voltage of the bias signal BS_n is maintained at the voltage VGH. That is, the closed loop formed by the above description locks the voltage V_N1 of the node N1 at the voltage VGL and the voltage of the bias signal BS_n at the voltage VGH. Therefore, the bias signal driver 420 may output the bias signal BS_n having the voltage VGH during the bias period BM from time t7 to time t10 and before time t0.

Figure 7:
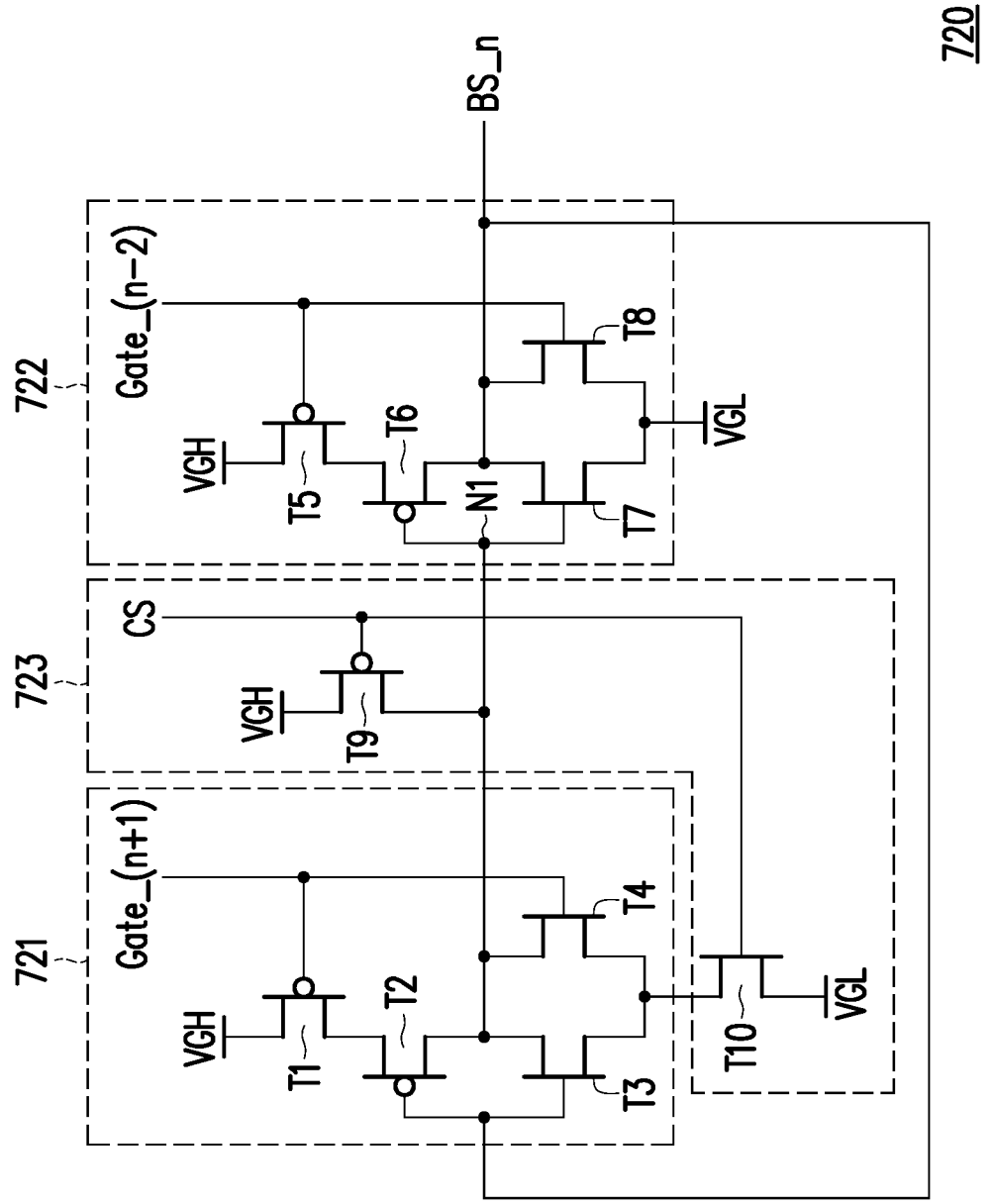
FIG. 7 is a circuit schematic diagram of a CMOS logic circuit of a bias signal driver according to another embodiment of the disclosure.

FIG. 7 is a circuit schematic diagram of a CMOS logic circuit of a bias signal driver according to another embodiment of the disclosure. Referring to FIG. 1 and FIG. 7, the bias signal driver 120_n of FIG. 1 may be implemented as a bias signal driver 720 of FIG. 7, and each bias signal driver of the disclosure may also be similarly implemented as the bias signal driver 720. In the embodiment of the disclosure, the bias signal driver 720 includes a first logic circuit 721, a second logic circuit 722 and a reset circuit 723. In the embodiment of the disclosure, the first logic circuit 721 and the second logic circuit 722 are two NOR gate circuits. The first logic circuit 721 includes a plurality of transistors T1 to T4, and the second logic circuit 722 includes a plurality of transistors T5 to T8. In the embodiment of the disclosure, the CMOS circuits of the first logic circuit 721 and the second logic circuit 722 may be the same as the CMOS circuits of the first logic circuit 521 and the second logic circuit 522 of FIG. 5, so details are not repeated here. The reset circuit 723 includes a first reset transistor T9 and a second reset transistor T10. The first reset transistor T9 may be a p-type transistor, and the second reset transistor T10 may be an n-type transistor, but the disclosure is not limited thereto.

In the embodiment of the disclosure, a first terminal of the first reset transistor T9 is electrically connected to the voltage VGH. A second terminal of the first reset transistor T9 is electrically connected to the node N1. A control terminal of the first reset transistor T9 receives an external reset signal CS. The second terminal of the transistor T3 and the second terminal of the transistor T4 is electrically connected to a first terminal of the second reset transistor T10. A second terminal of the second reset transistor T10 is electrically connected to the voltage VGL. A control terminal of the transistor T10 also receives the external reset signal CS.

Figure 8:
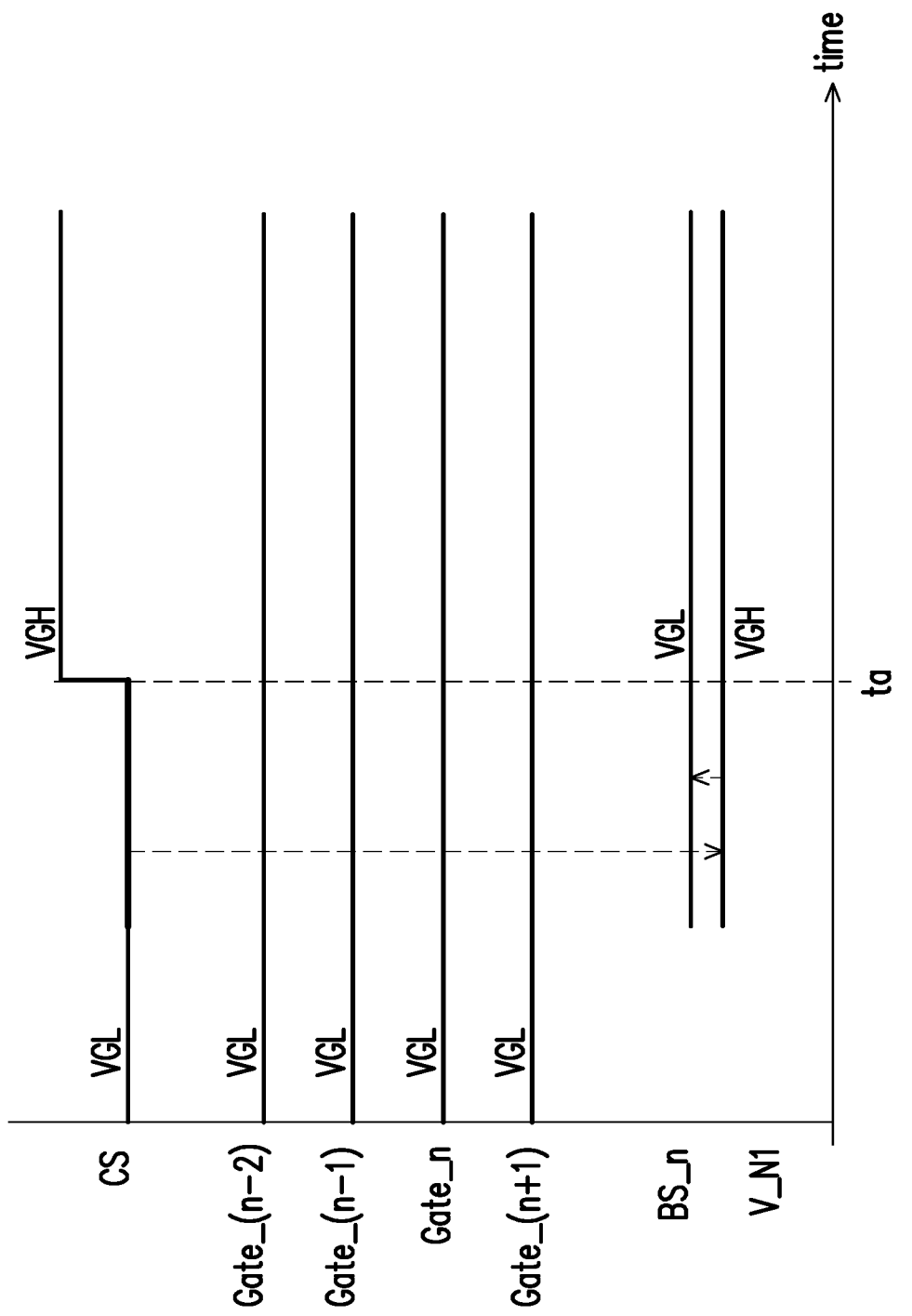
FIG. 8 is an operation timing diagram of the CMOS logic circuit according to the embodiment of FIG. 7 of the disclosure.

FIG. 8 is an operation timing diagram of the CMOS logic circuit according to the embodiment of FIG. 7 of the disclosure. Referring to FIG. 1, FIG. 7 and FIG. 8, in the embodiment of the disclosure, before time ta, the electronic device 100 may be operated in a power-on process, and the source driver IC 130 has not programmed the data voltage Vdata to the pixel unit. After time ta, the electronic device 100 may be operated in a normal operation to program the data voltage Vdata to the pixel unit.

In the embodiment of the disclosure, before the gate driver 110 drives the pixel array 101, the gate control signals Gate_(n−2), Gate_(n−1), Gate_n and Gate_(n+1) may have the voltage VGL. Before time ta, the external reset signal CS may have the voltage VGL. Thus, the first reset transistor T9 is turned-on, and the second reset transistor T10 is turned-off. Since the first reset transistor T9 is turned-on, the voltage V_N1 of the node N1 is maintained at the voltage VGH. Based on the voltage V_N1 of the node N1 having the voltage VGH, the transistor T6 is turned-off, and the transistor T7 is turned-on. Since the transistor T7 is turned-on, the voltage of the bias signal BS_n is maintained at the voltage VGL. Moreover, after time ta, the external reset signal CS may be changed to the voltage VGH. Since the gate control signal Gate_(n+1) has the voltage VGL, the transistor T1 is turned-on, and the transistor T4 is turned-off. Based on the voltage of the bias signal BS_n having the voltage VGL, the transistor T2 is turned-on, and the transistor T3 is turned-off. Since the transistor T1 and the transistor T2 are turned-on, the voltage V_N1 of the node N1 is maintained at the voltage VGH, and the voltage of the bias signal BS_n may also be maintained at the voltage VGL. Therefore, the bias signal driver 720 may maintain the voltage of the bias signal BS_n at the voltage VGL after the electronic device 100 is powered on and before programming Vdata, so as to prevent, for example, an unexpected bias voltage (Vs) be generated at the driver transistor Td of FIG. 2.

Figure 9:
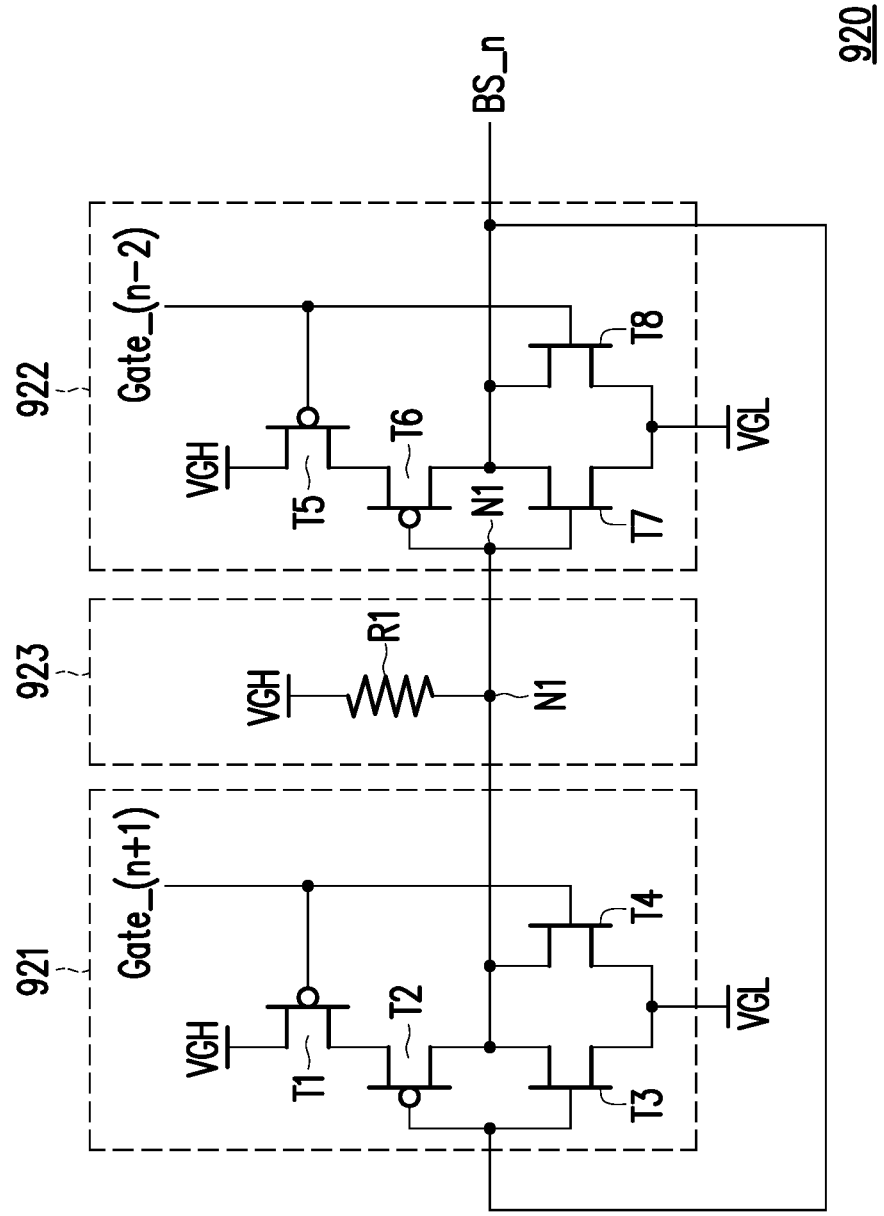
FIG. 9 is a circuit schematic diagram of a CMOS logic circuit of a bias signal driver according to another embodiment of the disclosure.

FIG. 9 is a circuit schematic diagram of a CMOS logic circuit of a bias signal driver according to another embodiment of the disclosure. Referring to FIG. 1 and FIG. 9, the bias signal driver 120_n of FIG. 1 may be implemented as a bias signal driver 920 of FIG. 9, and each bias signal driver of the disclosure may also be similarly implemented as the bias signal driver 920. In the embodiment of the disclosure, the bias signal driver 920 includes a first logic circuit 921, a second logic circuit 922 and a reset circuit 923. In the embodiment of the disclosure, the first logic circuit 921 and the second logic circuit 922 are two NOR gate circuits. The first logic circuit 921 includes a plurality of transistors T1 to T4, and the second logic circuit 922 includes a plurality of transistors T5 to T8. In the embodiment of the disclosure, the CMOS circuits of the first logic circuit 921 and the second logic circuit 922 may be the same as the CMOS circuits of the first logic circuit 521 and the second logic circuit 522 of FIG. 5, so details are not repeated here. The reset circuit 923 includes a resistor R1. In the embodiment of the disclosure, a first terminal of the resistor R1 is electrically connected to the voltage VGH. A second terminal of the resistor R1 is electrically connected to the node N1 between the first logic circuit 921 and the second logic circuit 922.

Figure 10:
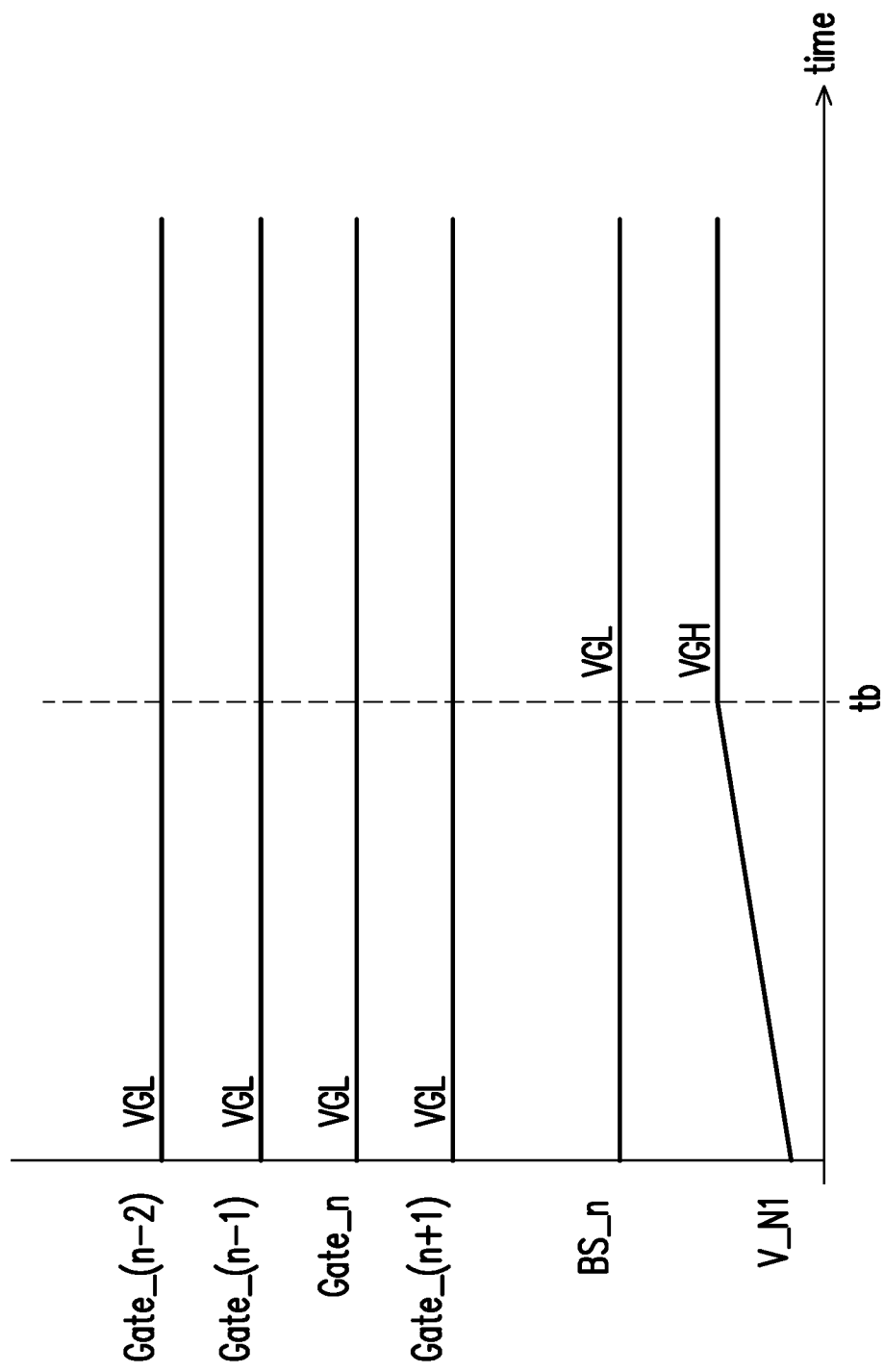
FIG. 10 is an operation timing diagram of the CMOS logic circuit according to the embodiment of FIG. 9 of the disclosure.

FIG. 10 is an operation timing diagram of the CMOS logic circuit according to the embodiment of FIG. 9 of the disclosure. Referring to FIG. 1, FIG. 9 and FIG. 10, in the embodiment of the disclosure, before time tb, the electronic device 100 may be operated in a power-on process, and the source driver IC 130 has not programmed the data voltage Vdata to the pixel unit. After time tb, the electronic device 100 may be operated in a normal operation to program the data voltage Vdata to the pixel unit.

In the embodiment of the disclosure, before the gate driver 110 drives the pixel array 101, the gate control signals Gate_(n−2), Gate_(n−1), Gate_n and Gate_(n+1) may have the voltage VGL. Before time tb, the voltage V_N1 of the node N1 may be is gradually pulled-up to the voltage VGH thought the resistor R1. Until time tb, the voltage V_N1 of the node N1 may be the voltage VGH. Moreover, after time tb, since the gate control signal Gate_(n+1) has the voltage VGL, the transistor T1 is turned-on, and the transistor T4 is turned-off. Based on the voltage of the bias signal BS_n having the voltage VGL, the transistor T2 is turned-on, and the transistor T3 is turned-off. Since the transistor T1 and the transistor T2 are turned-on, the voltage V_N1 of the node N1 is maintained at the voltage VGH, and the voltage of the bias signal BS_n may also be maintained at the voltage VGL. Therefore, the bias signal driver 920 may maintain the voltage of the bias signal BS_n at the voltage VGL after the electronic device 100 is powered on and before programming Vdata, so as to prevent, for example, an unexpected bias voltage (Vs) be generated at the driver transistor Td of FIG. 2.

Figure 11:
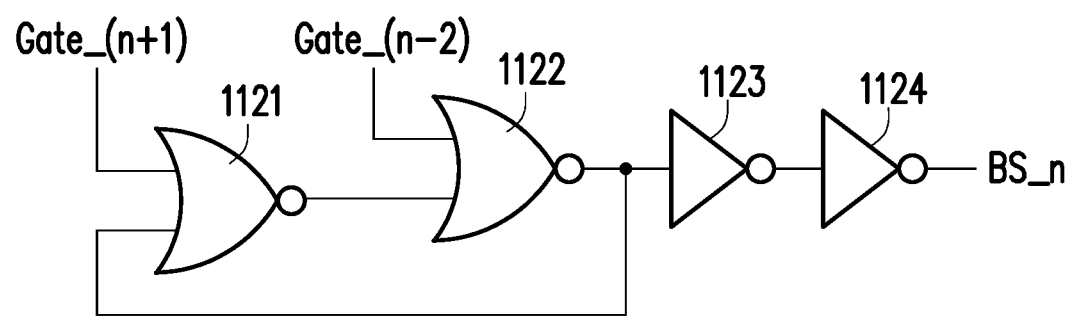
FIG. 11 is a circuit schematic diagram of a bias signal driver according to another embodiment of the disclosure.

FIG. 11 is a circuit schematic diagram of a bias signal driver according to another embodiment of the disclosure. Referring to FIG. 1 and FIG. 11, the bias signal driver 120_n of FIG. 1 may be implemented as a bias signal driver 1120 of FIG. 11, and each bias signal driver of the disclosure may also be similarly implemented as the bias signal driver 1120. In the embodiment of the disclosure, the bias signal driver 120 includes a first logic circuit 1121, a second logic circuit 1122, a first buffer circuit 1123 and a second buffer circuit 1124. The first logic circuit 1121 and the second logic circuit 1122 are two NOR gate circuits. A first input terminal of the first logic circuit 1121 is electrically connected to the gate line GL_(n+1) to receive the gate control signal Gate_(n+1), and a second terminal of the first logic circuit 1121 is electrically connected to an output terminal of the second logic circuit 1122 to receive an output signal of the second logic circuit 1122. A first input terminal of the second logic circuit 1122 is electrically connected to the gate line GL_(n−2) to receive the gate control signal Gate_(n−2), and a second terminal of the second logic circuit 1122 is electrically connected to an output terminal of the first logic circuit 1121 to receive an output signal of the first logic circuit 1121. The output terminal of the second logic circuit 1122 is electrically connected to an input terminal of the first buffer circuit 1123. An output terminal of the first buffer circuit 1123 is electrically connected to an input terminal of the second buffer circuit 1124. An output terminal of the second buffer circuit 1124 outputs the bias signal BS_n. In the embodiment of the disclosure, the first buffer circuit 1123 and the second buffer circuit 1124 may be complementary metal-oxide-semiconductor (CMOS) inverters. Therefore, the bias signal driver 1120 may provide the bias signal BS_n according to the gate control signal Gate_(n−2) and the gate control signal Gate_(n+1). Furthermore, the first buffer circuit 1123 and the second buffer circuit 1124 may enhance the ability of the bias signal driver 1120 to drive capacitive loading in active area (i.e. a parasitic capacitance of the bias signal BS_n).

Figure 12:
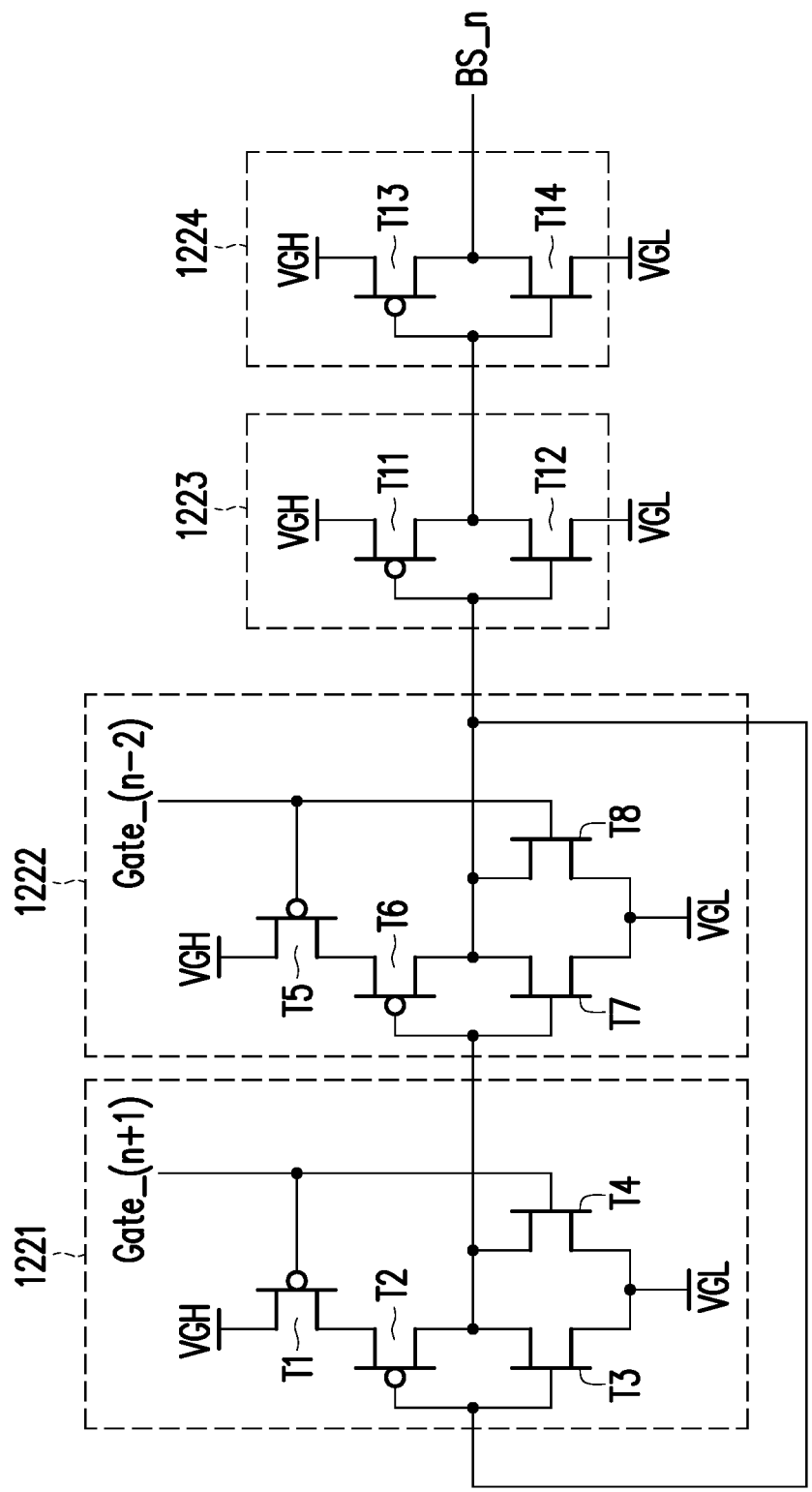
FIG. 12 is a circuit schematic diagram of a CMOS logic circuit according to the embodiment of FIG. 11 of the disclosure.

FIG. 12 is a circuit schematic diagram of the CMOS logic circuits according to the embodiment of FIG. 11 of the disclosure. In the embodiment of the disclosure, the first logic circuit 1121, the second logic circuit 1122, the first buffer circuit 1123 and the second buffer circuit 1124 of FIG. 11 may be implemented as the CMOS circuits as shown in FIG. 12, but the disclosure is not limited thereto. Referring to FIG. 12, the bias signal driver 1220 includes a first logic circuit 1221, a second logic circuit 1222, a first buffer circuit 1223 and a second buffer circuit 1224. The first logic circuit 1221 includes a plurality of transistors T1 to T4, and the second logic circuit 1222 includes a plurality of transistors T5 to T8. In the embodiment of the disclosure, the CMOS circuits of the first logic circuit 1221 and the second logic circuit 1222 may be the same as the CMOS circuits of the first logic circuit 521 and the second logic circuit 522 of FIG. 5, so details are not repeated here. The first buffer circuit 1223 includes a transistor T11 and a transistor T12. The second buffer circuit 1224 includes a transistor T13 and a transistor T14. The transistor T11 and the transistor T13 may be p-type transistors, and transistor T12 and transistor T14 may be n-type transistors, but the disclosure is not limited thereto.

In the embodiment of the disclosure, a first terminal of the transistor T11 is electrically connected to the voltage VGH. A second terminal of the transistor T11 is electrically connected to a first terminal of the transistor T12 and an output terminal of the first buffer circuit 1223. A control terminal of the transistor T11 is electrically connected to a control terminal of the transistor T12 and an output terminal of the second logic circuit 1222. The first terminal of the transistor T12 is electrically connected to the second terminal of the transistor T11 and the output terminal of the first buffer circuit 1223. A second terminal of the transistor T12 is electrically connected to the voltage VGL. The control terminal of the transistor T12 is electrically connected to the control terminal of the transistor T11 and the output terminal of the second logic circuit 1222.

In the embodiment of the disclosure, a first terminal of the transistor T13 is electrically connected to the voltage VGH. A second terminal of the transistor T13 is electrically connected to a first terminal of the transistor T14 and an output terminal of the second buffer circuit 1224. A control terminal of the transistor T13 is electrically connected to a control terminal of the transistor T14 and the output terminal of the first buffer circuit 1123. The first terminal of the transistor T14 is electrically connected to the second terminal of the transistor T13 and the output terminal of the second buffer circuit 1224. A second terminal of the transistor T14 is electrically connected to the voltage VGL. The control terminal of the transistor T14 is electrically connected to the control terminal of the transistor T13 and the output terminal of the first buffer circuit 1223.

In the embodiment of the disclosure, the first logic circuit 1221 and the second logic circuit 1222 may be operated as the above-mentioned operation timing diagram of embodiment of FIG. 6, so as to generate the bias signal BS_n. Moreover, the first buffer circuit 1223 and the second buffer circuit 1224 to may effectively enhance capability of the bias signal BS_n to drive capacitive loading in active area (i.e. a parasitic capacitance of the bias signal BS_n).

Figure 13:
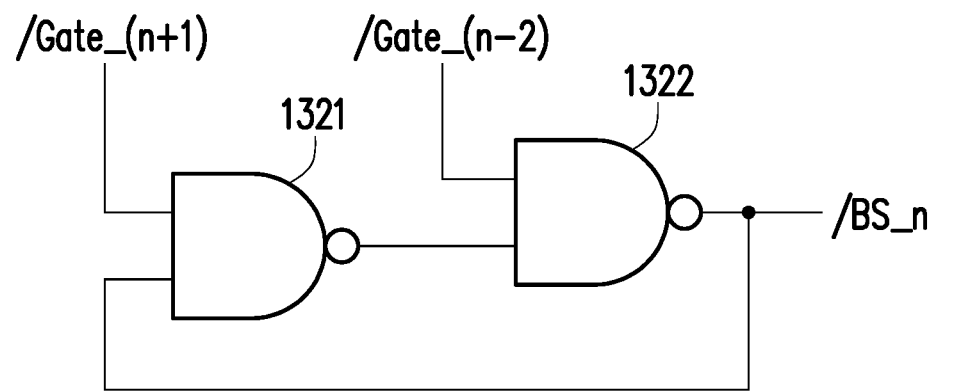
FIG. 13 is a circuit schematic diagram of a bias signal driver according to another embodiment of the disclosure.

FIG. 13 is a circuit schematic diagram of a bias signal driver according to another embodiment of the disclosure. Referring to FIG. 1, FIG. 2 and FIG. 13, in one embodiment of the disclosure, if the scan transistor Ts, the compensation transistor Tc, the bias transistor Tb and the reset transistor Tc of the voltage source circuit 242 of FIG. 2 are p-type transistors, the gate driver 110 may provide a gate control signal/Gate_(n−2) and a gate control signal/Gate_n having signal waveforms inverse to the gate control signal Gate_(n−2) and the gate control signal Gate_n to the bias signal driver 120_n, and the bias signal driver 120_n of FIG. 1 may be implemented as a bias signal driver 1320 of FIG. 13, and each bias signal driver of the disclosure may also be similarly implemented as the bias signal driver 1320. Thus, the bias signal driver 120_n may generate a bias signal BS_n having signal waveforms inverse to the bias signal BS_n. In the embodiment of the disclosure, the bias signal driver 1320 includes a first logic circuit 1321 and a second logic circuit 1322. The first logic circuit 1321 and the second logic circuit 1322 are two NAND gate circuits. A first input terminal of the first logic circuit 1321 is electrically connected to the gate line GL_(n+1) to receive the gate control signal/Gate_(n+1), and a second terminal of the first logic circuit 1321 is electrically connected to an output terminal of the second logic circuit 1322 to receive the bias signal/BS_n. A first input terminal of the second logic circuit 1322 is electrically connected to the gate line GL_(n−2) to receive the gate control signal/Gate_(n−2), and a second terminal of the second logic circuit 1322 is electrically connected to an output terminal of the first logic circuit 1321 to receive an output signal of the first logic circuit 1321. The output terminal of the second logic circuit 1322 outputs the bias signal/BS_n according to the gate control signal/Gate_(n−2) and the output signal of the first logic circuit 1321. Therefore, the bias signal driver 1320 may provide the bias signal BS_n according to the gate control signal/Gate_(n−2) and the gate control signal/Gate_(n+1).

Figure 14:
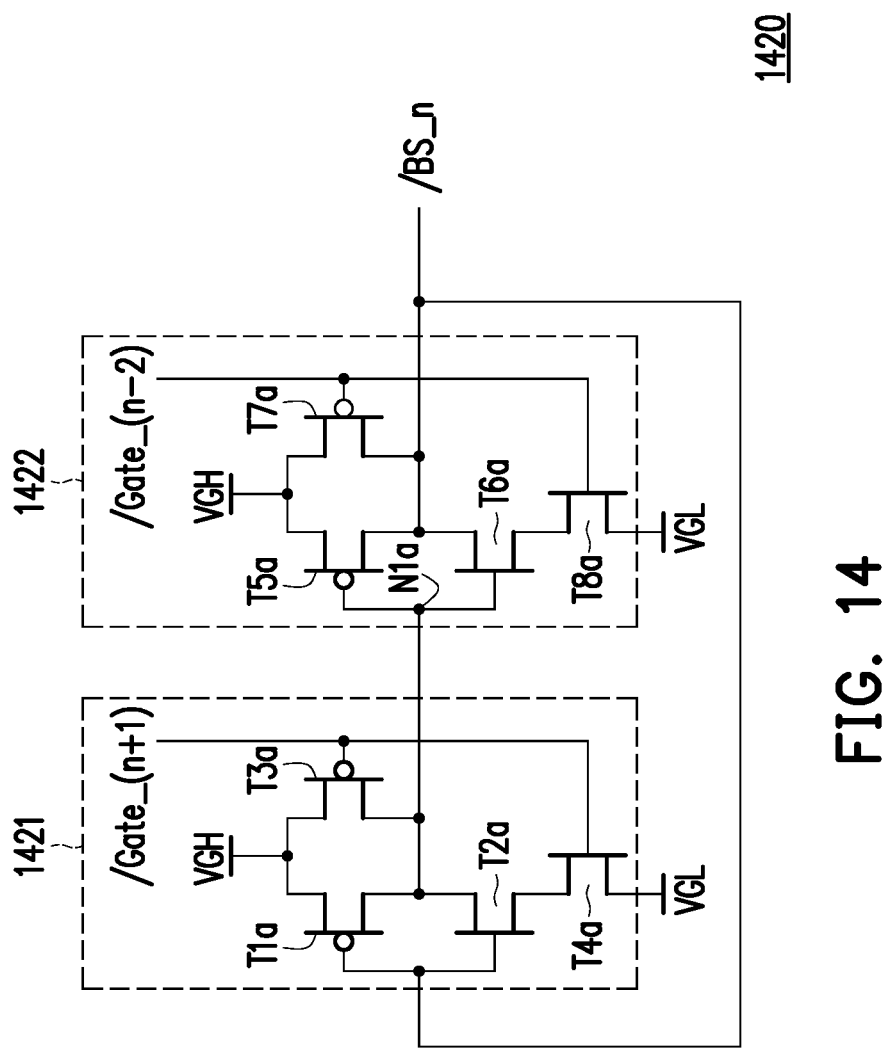
FIG. 14 is a circuit schematic diagram of a CMOS logic circuit according to the embodiment of FIG. 13 of the disclosure.

FIG. 14 is a circuit schematic diagram of the CMOS logic circuit according to the embodiment of FIG. 13 of the disclosure. In the embodiment of the disclosure, the first logic circuit 1321 and the second logic circuit 1322 of FIG. 13 may be implemented as the CMOS logic circuit as shown in FIG. 14, but the disclosure is not limited thereto. Referring to FIG. 14, the bias signal driver 1420 includes a first logic circuit 1421 and a second logic circuit 1422. The first logic circuit 1421 includes a plurality of transistors T1a to T4a, and the second logic circuit 1422 includes a plurality of transistors T5a to T8a. In the embodiment of the disclosure, a first terminal of the transistor T1a is electrically connected to a voltage VGH. A second terminal of the transistor T1a is electrically connected to a first terminal of the transistor T2a and a node N1a between the first logic circuit 1421 and the second logic circuit 1422. A control terminal of the transistor T1a is electrically connected to a control terminal of the transistor T2a and an output terminal of the second logic circuit 1422. The first terminal of the transistor T2a is electrically connected to the second terminal of the transistor T1a and the node N1a. A second terminal of the transistor T2a is electrically connected to a first terminal of the transistor T4a. A control terminal of the transistor T2a is electrically connected to the control terminal of the transistor T1a and the output terminal of the second logic circuit 1422. A first terminal of the transistor T3a is electrically connected to the voltage VGH. A second terminal of the transistor T3a is electrically connected to the second terminal of the transistor T1a, the first terminal of the transistor T2a and the node N1a. A control terminal of the transistor T3a is electrically connected to the gate line GL_(n+1) to receive the gate control signal/Gate_(n+1). A first terminal of the transistor T4a is electrically connected to the second terminal of the transistor T2a. A second terminal of the transistor T4a is electrically connected to a voltage VGL. A control terminal of the transistor T4a is electrically connected to the gate line GL_(n+1) to receive the gate control signal/Gate_(n+1).

In the embodiment of the disclosure, a first terminal of the transistor T5a is electrically connected to the voltage VGH. A second terminal of the transistor T5a is electrically connected to a first terminal of the transistor T6a and an output terminal of the second logic circuit 1422. A control terminal of the transistor T5a is electrically connected to a control terminal of the transistor T6a and the node N1a (i.e. the output terminal of the first logic circuit 1421). The first terminal of the transistor T6a is electrically connected to the second terminal of the transistor T5a and the output terminal of the second logic circuit 1422. A second terminal of the transistor T6a is electrically connected to a first terminal of the transistor T8a. A control terminal of the transistor T6a is electrically connected to the control terminal of the transistor T5a and the node N1a (i.e. the output terminal of the first logic circuit 1421). A first terminal of the transistor T7a is electrically connected to the voltage VGH. A second terminal of the transistor T7a is electrically connected to the second terminal of the transistor T5a, the first terminal of the transistor T6a and an output terminal of the second logic circuit 1422. A control terminal of the transistor T7a is electrically connected to the gate line GL_(n−2) to receive the gate control signal/Gate_(n−2). A first terminal of the transistor T8a is electrically connected to the second terminal of the transistor T6a. A second terminal of the transistor T8a is electrically connected to the voltage VGL. A control terminal of the transistor T8a is electrically connected to the gate line GL_(n−2) to receive the gate control signal/Gate_(n−2).

In the embodiment of the disclosure, the transistors T1a, T3a, T5a and T7a may be p-type transistors, and the transistors T2a, T4a, T6a and T8a may be n-type transistors. The voltage VGH may be greater than the voltage VGL, but the disclosure is not limited thereto.

Figure 15:
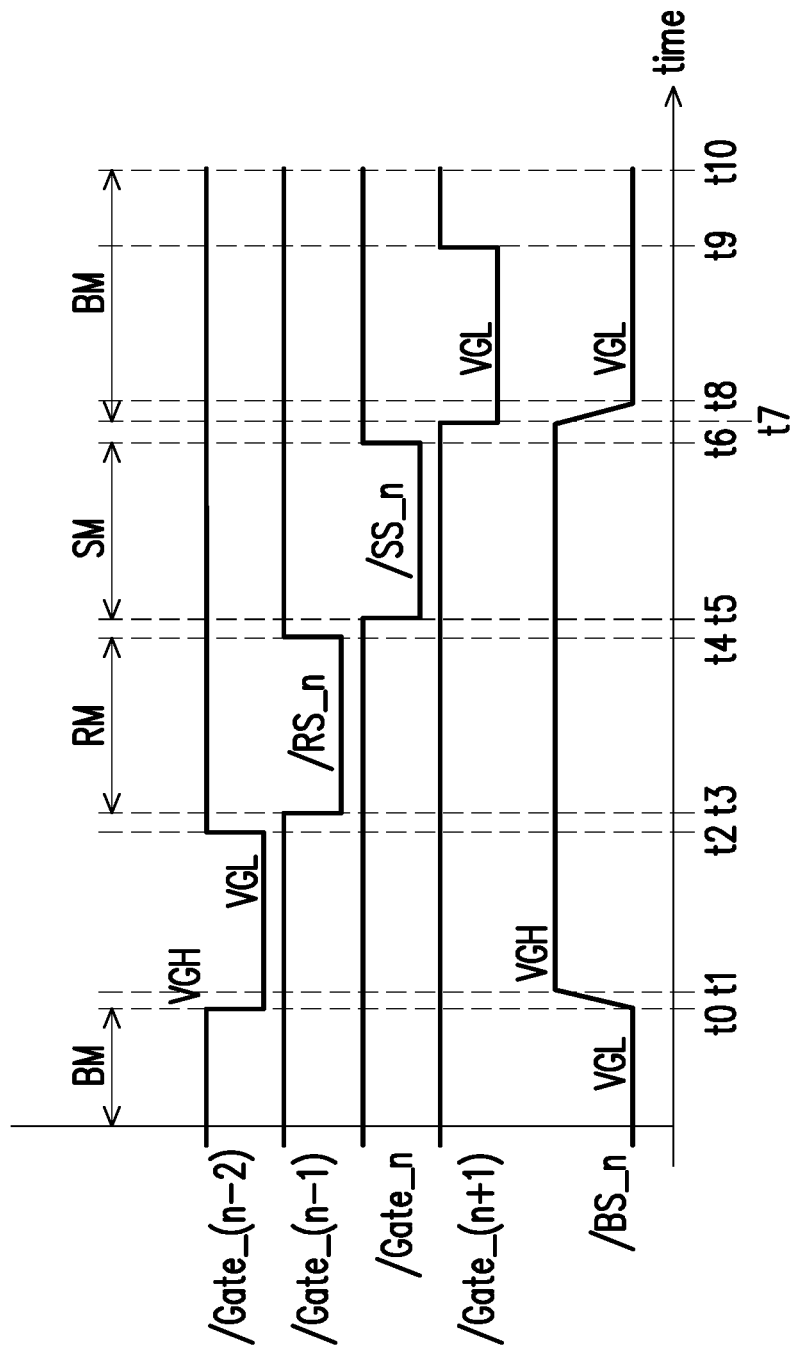
FIG. 15 is an operation timing diagram of the CMOS logic circuit according to the embodiment of FIG. 14 of the disclosure.

FIG. 15 is an operation timing diagram of the CMOS logic circuit according to the embodiment of FIG. 14 of the disclosure. Referring to FIG. 1, FIG. 14 and FIG. 15, in the embodiment of the disclosure, the gate control signal/Gate_(n−2) to/Gate_n having signal waveforms inverse to the gate control signal Gate_(n−2) to Gate_n. During the period from time t0 to time t2, the gate control signal/Gate_(n−2) is changed to the voltage VGL, and the gate control signal/Gate_(n+1) is maintained at the voltage VGH. Thus, based on the gate control signal/Gate_(n−2) having the voltage VGL, the transistor T7a is turned-on, and the transistor T8a is turned-off. Since the transistor T7a is turned-on, the voltage of the bias signal/BS_n is pulled-up from the voltage VGL to the voltage VGH during the period from time t0 to time t1. Based on the bias signal/BS_n having the voltage VGH, the transistor T1a is turned-off, and the transistor T2a is turned-on. Based on the gate control signal/Gate_(n+1) having the voltage VGH, the transistor T3a is turned-off, and the transistor T4a is turned-on. Since the transistor T2a and the transistor T4a are turned-on, the voltage of the node N1a is pulled-down from the voltage VGH to the voltage VGL during the period from time t0 to time t1, and the voltage of the node N1a is maintained at the voltage VGL during the period from time t1 to time t2.

During the reset period RM from time t3 to time t4, the gate control signal/Gate_(n−1) is changed to the voltage VGL, which is directly used as the reset signal/RS_n. During the scan period SM from time t5 to time t6, the gate control signal/Gate_n is changed to the voltage VGL, which is directly used as the scan signal/SS_n. During the period from time t2 to time t7, the gate control signal/Gate_(n−2) and the gate control signal/Gate_(n+1) are maintained at the voltage VGH. Thus, based on the gate control signal/Gate_(n+1) having the voltage VGH, the transistor T4a is turned-on, and the transistor T3a is turned-off. Based on the bias signal BS_n having the voltage VGH before time t2, the transistor T1a is turned-off and the transistor T2a is turned-on. Since the transistor T2a and the transistor T4a are turned-on, the voltage of the node N1a is maintained at the voltage VGL. Moreover, based on the gate control signal/Gate_(n−2) having the voltage VGH, the transistor T7a is turned-off and the transistor T8a is turned-on. Based on the voltage of the node N1a having the voltage VGL, the transistor T5a is turned-on, and the transistor T6a is turned-off. Since the transistor T5a is turned-on, the voltage of the bias signal BS_n is maintained at the voltage VGH. That is, the closed loop formed by the above description locks the voltage of the node N1a at the voltage VGL and the voltage of the bias signal/BS_n at the voltage VGH.

During the bias period BM from time t7 to time t10 and before time t0, the bias signal driver 1420 may output the bias signal/BS_n having the voltage VGL. During the period from time t7 to time t9, the gate control signal/Gate_(n−2) is maintained at the voltage VGH, and the gate control signal/Gate_(n+1) is changed to the voltage VGL. Thus, based on the gate control signal/Gate_(n+1) having the voltage VGL, the transistor T3a is turned-on, and the transistor T4a is turned-off. Since the transistor T3a is turned-on, the voltage of the node N1a is pulled-up from the voltage VGL to the voltage VGH during the period from time t7 to time t8. Based on the gate control signal/Gate_(n−2) having the voltage VGH, the transistor T7a is turned-off, and the transistor T8a is turned-on. Based on the voltage of the node N1a having the voltage VGH, the transistor T5a is turned-off, and the transistor T6a is turned-on. Since the transistor T6a and the transistor T8a are turned-on, the voltage of the bias signal/BS_n is pulled-down from the voltage VGH to the voltage VGL.

Moreover, during the period from time t9 to time t10 and before time t0, the gate control signal/Gate_(n−2) and the gate control signal/Gate_(n+1) are maintained at the voltage VGH. Thus, based on the gate control signal/Gate_(n+1) having the voltage VGH, the transistor T3a is turned-off, and the transistor T4a is turned-on. Based on the bias signal BS_n having the voltage VGL before time t9, the transistor T1a is turned-on and the transistor T2a is turned-off. Since the transistor T1a is turned-on, the voltage of the node N1a is maintained at the voltage VGH. Moreover, based on the gate control signal/Gate_(n−2) having the voltage VGH, the transistor T7a is turned-off, and the transistor T8a is turned-on. Based on the voltage of the node N1a having the voltage VGH, the transistor T5a is turned-off, and the transistor T6a is turned-on. Since the transistor T6a and the transistor T8a are turned-on, the voltage of the bias signal BS_n is maintained at the voltage VGL. That is, the closed loop formed by the above description locks the voltage of the node N1 at the voltage VGH and the voltage of the bias signal BS_n at the voltage VGL. Therefore, the bias signal driver 1420 may output the bias signal BS_n having the voltage VGL during the bias period BM from time t7 to time t10 and before time t0.

In summary, the electronic device of the disclosure may generate the bias signal to activate the pixel unit according to the part of the plurality of gate control signals without additionally disposing a complicated bias signal generation IC, and the pixel unit may receive the scan signal, the reset signal, and the bias signal to implement the compensation of the threshold voltage of the driving voltage and the driving current for the electronic element.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device, comprising:
   a pixel array, comprising a pixel unit;
   a gate driver, configured to generate a plurality of gate control signals; and
   a bias signal driver, electrically connected to the pixel unit and the gate driver, and configured to generate a bias signal to activate the pixel unit according to a part of the plurality of gate control signals,
   wherein the bias signal driver comprises a first logic circuit and a second logic circuit,
   wherein a first input terminal of the first logic circuit receives an (n+1)-th gate control signal of the plurality of gate control signals, and a second input terminal of the first logic circuit is electrically connected to an output terminal of the second logic circuit,
   wherein a first input terminal of the second logic circuit receives an (n−2)-th gate control signal of the plurality of gate control signals, and a second input terminal of the second logic circuit is electrically connected to an output terminal of the first logic circuit,
   wherein n is a positive integer.

2. The electronic device according to the claim 1, wherein the pixel unit comprises an electronic element.

3. The electronic device according to the claim 2, wherein the pixel unit further comprises a voltage source circuit electrically connected to the electronic element, and the electronic element is a voltage-controlled element.

4. The electronic device according to the claim 3, wherein the electronic element comprises a varactor.

5. The electronic device according to the claim 2, wherein the pixel unit further comprises a current source circuit electrically connected to the electronic element, and the electronic element is a current-controlled element.

6. The electronic device according to the claim 3, wherein the electronic element comprises a light emitting diode.

7. The electronic device according to the claim 1, wherein an (n−1)-th gate control signal of the plurality of gate control signals is configured to reset a plurality of pixel units of an n-th row of the pixel array, wherein n is a positive integer.

8. The electronic device according to the claim 1, wherein an n-th gate control signal of the plurality of gate control signals is configured to set a data voltage for a plurality of pixel units of an n-th row of the pixel array, wherein n is a positive integer.

9. The electronic device according to the claim 1, wherein the bias signal driver is configured to receive an i-th gate control signal and an j-th gate control signal, and generate the bias signal to activate a plurality of pixel units of an n-th row of the pixel array, wherein i, j and n are positive integers,
   wherein i is smaller than (n−1), and j is greater than n.

10. The electronic device according to the claim 9, wherein i is equal to (n−2).

11. The electronic device according to the claim 9, wherein j is equal to (n+1).

12. The electronic device according to the claim 9, wherein the first logic circuit and the second logic circuit are the same logic circuit.

13. The electronic device according to the claim 9, wherein the first logic circuit and the second logic circuit are two NOR gate circuits or two NAND gate circuits.

14. The electronic device according to the claim 9, wherein the first logic circuit and the second logic circuit comprises two n-type transistors and two p-type transistors.

15. The electronic device according to the claim 9, wherein the first logic circuit is configured to receive the j-th gate control signal and the bias signal,
   wherein the second logic circuit is configured to receive the i-th gate control signal and an output signal of the first logic circuit, and output the bias signal.

16. The electronic device according to the claim 9, wherein the bias signal driver further comprises a reset circuit.

17. The electronic device according to the claim 16, wherein the reset circuit comprises a reset transistor, and the reset transistor receives a reset signal.

18. The electronic device according to the claim 16, wherein the reset circuit comprises a resistor, and the resistor is electrically connected to a node between the first logic circuit and the second logic circuit.

19. The electronic device according to the claim 9, wherein the bias signal driver further comprises a buffer circuit.

20. The electronic device according to the claim 19, wherein the buffer circuit comprises a CMOS inverter.

* * * * *